United States Patent [19]
Mogi et al.

[11] Patent Number: 4,799,897
[45] Date of Patent: Jan. 24, 1989

[54] IC TESTER SOCKET

[75] Inventors: Hiroyuki Mogi; Kazuhisa Ozawa, both of Kawaguchi, Japan

[73] Assignee: Dai-ichi Seiko Kabushiki Kaisha, Kawaguchi, Japan

[21] Appl. No.: 946,584

[22] Filed: Dec. 23, 1986

[30] Foreign Application Priority Data

Dec. 30, 1985 [JP] Japan .............................. 60-204384[U]
Sep. 1, 1986 [JP] Japan .............................. 61-133941[U]

[51] Int. Cl.⁴ ............................................. H01R 9/09
[52] U.S. Cl. ...................................... 439/264; 439/70; 439/266
[58] Field of Search ............. 339/17 CF, 74 R, 75 M, 339/75 MP; 439/70–73, 259–270, 525, 526

[56] References Cited

U.S. PATENT DOCUMENTS

| | | | |
|---|---|---|---|
| 3,910,664 | 10/1975 | Pauza et al. ..................... | 339/17 CF |
| 4,089,575 | 5/1978 | Grabbe ............................ | 339/17 CF |
| 4,222,622 | 9/1980 | Griffin et al. .................. | 339/17 CF |
| 4,491,377 | 1/1985 | Pfaff ............................. | 339/74 R |
| 4,498,047 | 2/1985 | Hexamer et al. ................ | 339/75 MP |
| 4,533,192 | 8/1985 | Kelley ............................ | 339/75 MP |
| 4,623,208 | 11/1986 | Kerul et al. .................... | 339/17 CF |
| 4,630,875 | 12/1986 | Korsunsky et al. ............. | 339/17 CF |
| 4,645,279 | 2/1987 | Grabbe et al. .................. | 339/258 P |
| 4,676,571 | 6/1987 | Petersen et al. ................ | 436/261 |
| 4,691,975 | 9/1987 | Fukunaga et al. .............. | 439/266 |

Primary Examiner—J. Patrick McQuade
Attorney, Agent, or Firm—Spensley Horn Jubas & Lubitz

[57] ABSTRACT

An IC tester socket comprises a spring for keeping the socket body and the spacer frame in their state of being spaced apart from each other with a predetermined interval; and contacting pins each having a spring portion shaped in a pair of arcuate forms, in order to ensure the contact between the lead terminals of an IC requiring testing and the contacting pins to be realized positively and stably and to make it possible for the socket to stand its use for a prolonged period of time. The arm of each contacting pin which is brought into contact with the side face to its mating lead terminal of the IC is adapted to contact the side face of the lead terminal, and is so shaped as to be able to lock the IC package at the position of contact of this arm.

10 Claims, 6 Drawing Sheets

IC TESTER SOCKET

BACKGROUND OF THE INVENTION (a) Field of the invention:

The present invention relates to an improvement of the IC tester socket which is suitable for use in the performance test of a flat type IC (Integrated Circuit) having curved lead terminals and like testing.

(b) Description of the prior art:

Flat type IC tester sockets have been constructed in the past so that, as shown in FIG. 1, by urging, via an urging member A, the bottom face RF of a lead terminal R of an IC package (note: in actual practice, a face connected to, for example, the circuit line of the printed circuit board) to a top face CF for contact of a contacting pin C attached to an electrically insulated socket body B, the connection of the lead terminal R with the contacting pin C is established.

With the above-mentioned structure, however, the contact face RF of the lead terminal R of the IC package P tends to be injured easily, and moreover there occurs deposition of dust onto this contact face, and furthermore, dust could fill in the space existing therearound. In such a case, it should be noted that, in a compact-size IC package P, the pitch size between adjacent lead terminals R is very small, and accordingly it is difficult to easily remove the dust which has deposited onto the lead terminal portions. Especially, in case of such dust that cannot be found with the naked eye, there would arise the risk that the IC package bearing unnoticeable dust is shipped as being an acceptable product in the performance test. However, when, in actual practice, such an IC package as mentioned above is mounted on a printed circuit board and soldered, it would cause poor soldering, or even when the IC package is soldered once to the printed circuit board, the soldered portion would come off at a later date and develop a disorder in the connection, causing the IC-mounted hardwares to become inoperative. Also, in such a case as mentioned above, it is the general trend that the circuitry is compact in size and complex, so that it is extremely difficult to check and find the bad spot, and a lot of time is required for inspection. In order to preliminarily prevent such disorder and trouble from taking place, a close inspection step has to be introduced before the assembling step.

In order to solve the above-mentioned problems, there has been proposed a tester socket which is constructed so that the contacting pins are brought into contact with the side faces of the lead terminals (U.S. Pat. No. 4,491,377). FIGS. 2A and 2B show an example of such a tester socket. More particularly, the contacting pin C has its upper portion made in a bifurcated fork shape and has a downwardly and inwardly extending slant top face $C_1$, and has its lower portion inserted in the socket body B. An urging member A, when viewed from thereabove along the arrow in FIG. 2A, is of a square frame shape whose central portion is open, and is attached to the socket body B via guide columns G for vertical movement. Inside this urging member A, there is formed an inclined face $A_1$ which is brought into a sliding contact with the slant top face $C_1$ of the contacting pin C. This contacting pin C is flat in shape and is so made that elastic force acts upon it in a direction to cause the respective arms of its bifurcated fork portion to part away from each other. The magnitude of the elastic force is selected to be in the level of being able to hold the urging member A in its position of FIG. 2A against its own gravity in the relaxed position thereof in FIG. 2A. FIG. 2A shows the state that an IC package P which requires testing is placed in position through the central opening or cavity of the urging member A. In this state, by downwardly pushing the urging member A in the direction of the arrow, the slant top face $C_1$ of the contacting pin C is urged by the inclined face $A_1$ of the urging member A, causing the inner arm of the fork thereof to be displaced to the tensioned position of FIG. 2B. As a result, the IC package P drops onto the position it is received by the socket body B and rests thereat. In this state, by relieving the urging force applied to the urging member A, the tensioned fork arm tends to return to its relaxed position by its own restoring force. However, because the side face $C_2$ of the fork arm is in pressure-contact with the side face $R_1$ of the lead terminal R, the fork arm is forced to stop in this position, and accordingly the IC package P is rendered to the state of being nipped at both sides by the contacting pins C. Thus, when various kinds of test have been completed, the urging member A is pressed downwardly again. Whereupon, the IC package P can be taken out easily. By subsequently releasing the pressure applied to the urging member A, both the contacting pins and the urging member restore their respective positions shown in FIG. 2A.

Now, sockets of this type, in general, are small in the size of the whole body and accordingly the contacting pins are made thin and small in size. The conventional socket having the above-described improved struruture is of such an arrangement that a markedly heavy load is forced to be applied to a portion of the contacting pin, i.e. a structure that one of the fork arms of the respective contacting pins is forced to exert the following two functions, one of which is to support the urging member and the other is to hold the contact pressure applied to the mating lead terminal. Hence, there is the drawback that the contacting pins tend to become fatigued easily, and that according they cannot stand their use for an extended period of time. In other words, when the base portion of the fork arm becomes fatigued, it immediately develops mal-contact so that the tester socket will become unusable. Also, in the tester socket having the abovedescribed conventional structure, its contact pins do not have a configuration which makes it possible to maintain a sufficient and proper elastic force.

SUMMARY OF THE INVENTION

It is, therefore, a primary object of the present invention to provide an IC tester socket having contacting pins arranged to be able to positively and securely contact, under proper pressure, the side faces of the lead terminals of the IC and also to be reduced of the load applied to the contacting pins per se to thereby be able to stand their use for a prolonged period of time.

Another object of the present invention is to provide an IC tester socket which is very safe and displays a high degree of performance because of the arrangement that the contact between the contacting pins and the lead terminals are positively established so as to allow an IC package to be mounted in either the normal or the upside-down posture and also that, when the socket body is inverted, the mounted IC package will never drop out of the socket.

A further object of the present invention is to provide an IC tester socket which allows an IC package to be smoothly and snugly seated in the predetermined position in the socket without requiring a special attention at the time the IC package is mounted.

Still another object of the present invention is to provide an IC tester socket which eliminates the occurrence of poor contact due to the shifting of the positions at which the contact pins are provided and the occurrence of poor contact due to the wear of the spring portions of the respective contacting pins.

These and other objects as well as the features and the advantages of the present invention will be apparent from the following detailed description of the preferred embodiments when taken in conjunction with the accompanying drawings.

DETAILED DESCRIPTION OF THE PREFERRED EMBODIMENTS

Figure 3:
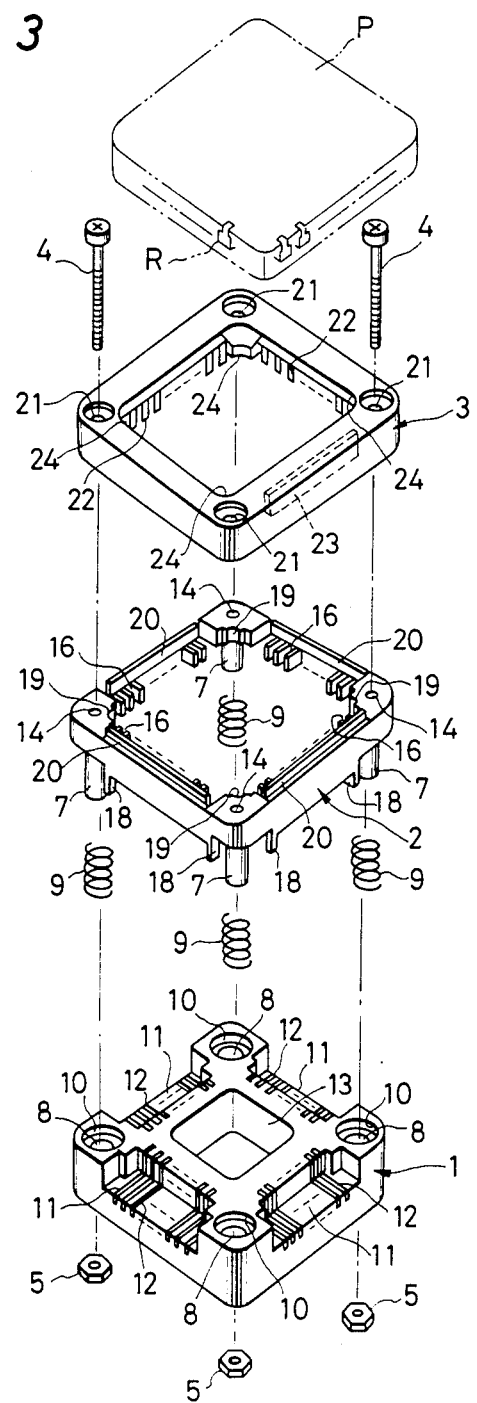
FIG. 3 is an exploded perspective view showing the overall structure of an IC tester socket according to the present invention excluding the contacting pins.
Figure 4:
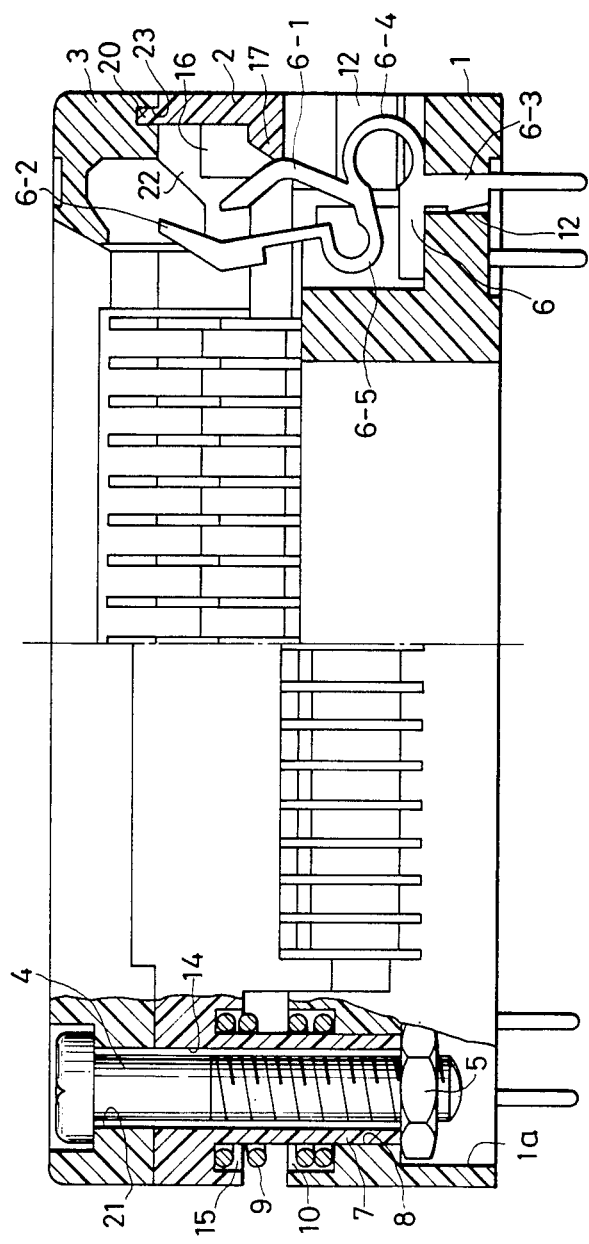
FIG. 4 is a side elevation, partly broken away, showing a first embodiment of the IC tester socket according to the present invention.

By first referring to FIGS. 3 and 4, description will be made of the general structure of the IC tester socket according to the present invention. This IC tester socket is of the structure that, upon a square socket body 1, a spacer frame 2 and an urging cover 3 both having the same shape as that of the socket body 1 are superposed. The spacer 2 and the urging cover 3 are attached by screws 4 and nuts 5 provided at four corners of these respective members so as to allow the vertical movement thereof. The socket body 1 is provided, on the respective sides of the square body, with contacting pins 6 (FIG. 4) extending outwardly from the body in parallel with each other and at predetermined intervals. The spacer 2 and the urging cover 3 are normally separated away from the socket body 1 by means of springs 9 loosely mounted on cylindrical portions 7 which are provided at the four corners of the spacer 2 and which are loosely inserted through bores 8 provided through the four corners of the socket body 1. The upper face of each bore 8 is provided with an upper recess 10 intended for seating its mating spring 9, and between two such upper recesses 10 and 10 is provided a cut-out having an L-shaped cross section, and grooves 12 for receiving contacting pins 6 are provided in a row n the lower face of the cut-out 11, and an air passageway opening or cavity 13 for cooling is provided centrally of each of the three members 1, 2 and 3.

The spacer 2 is a frame having an external configuration which is the same as that of the socket body 1. This spacer frame 2 is provided, at its four corners, with bores 14 (FIG. 4) for the passage therethrough of screws, and from the underside of these bores 14 protrude the cylinder portions 7 which are intended for mounting the springs 9 thereon, respectively. The base portions of these cylindrical portions 7 are provided with circular recesses 15 to serve as the receiving saucers for said springs 9. Also, in each of the four inner sides of this spacer frame 2 are provided a row of cut-outs 16 for the insertion therein of first arms 6-1 of the contacting pins 6, respectively. At the bottom of these cut-outs 16 of each row is formed a jetty 17 intended to urge said first arms 6-1 of the contacting pins 6, and at both ends of this jetty are provided guide plates 18, 18, respectively. Also, at the four corners of the spacer 2 are provided corner portions 19 hvaing an L-shaped cross section, formed to match the external configuration of the IC package P, and on the upper face of the spacer 2, along each of the four sides of this spacer, there is provided a jetty 20.

The urging cover 3 is comprised of a frame similar to the spacer frame 2, and has bores 21 formed at the four corners thereof for the passage of screws 4 therethrough. On the inner sides of the bottom face of the urging cover 3 are provided but-outs 22 for the insertion therein of second arms 6-2 of the contacting pins 6, respectively, and on the underside of the four sides of this urging cover 3 are provided grooves 23, respectively, for the insertion therein, for positioning, of the jetties 20 of said spacer 2, and at the inner four corners of the spacer 2, there are provided slant-faced corner portions 24 which contact the corner portions 19 of the spacer 19, respectively.

In this instant embodiment, the spacer 2 and the urging cover 3 are fixed together by means of the screws 4. It should be noted here that, instead of the above-mentioned structure, these two members 2 and 3 may be molded as an integral body to serve as a single urging member. It should be noted here also that, in this embodiment, the socket body 1, the spacer 2 and the urging cover 3 are invariably produced by extrusion-molding of PPS resin as the constituting material of these members.

Next, description will be made in detail of the abovesaid contacting pins 6. The contacting pin 6 is made by plating a punched thin flat metal plate having an appropriate elasticity. It comprises a first spring porton 6-4 which is curved to have a substantially round shape and which extends above and contiguous from the leg portion 6-3 which is inserted in a groove 12 of the socket body; a second spring portion 6-5 extending from the foremost end of said first spring portion 6-4 and being curved in a direction opposite to the direction of the curve of said first spring portion 6-4; said first arm 6-1 extending from a site between said first spring portion 6-4 and said second spring portion 6-5 and being urged by said jetty 17 of the urging cover 3; and said second arm 6-2 extending from the foremost end of the second spring portion 6-5.

Next, description will be made of an example of assembly of the IC tester socket. To begin with, the contacting pin 6 is inserted in the mating groove 12 of the socket body 1 in such a way that the second arm 6-2 of the contacting pin 6 is positioned on the inner side of the groove 12. Next, the jetty of the spacer 2 is inserted in the groove 23 of the urging cover 3 for engagement therewith, and these two members 3 and 2 are placed one upon another. In this state, the cylindrical portion 7 of the spacer 2 is fit in the vertical opening of the coil-shaped spring 9 whose lower portion rests in the upper recess 10 provided on the socket body 1, and along therewith said cylindrical portion 7 is inserted into the bore 8. As a result, the second arm 6-2 of the contacting pin 6 becomes loosely inserted in the cut-out 22 of the urging cover 3 and along therewith the first arm 6-1 of the contacting pin 6 becomes loosely inserted into the cut-out 16 of the spacer 2. Subsequently, the screw 4 is passed through the bore 21 of the urging cover 3, the bore 14 of the spacer 2 and through the bore of the cylindrical portion 7, and then the screw 4 is threaded through the nut 5 which is provided in the recess 1a of the bottom face of the socket body 1 to thereby unite the socket body 1 to the spacer 2 and to the urging cover 3 together.

Figure 5A:
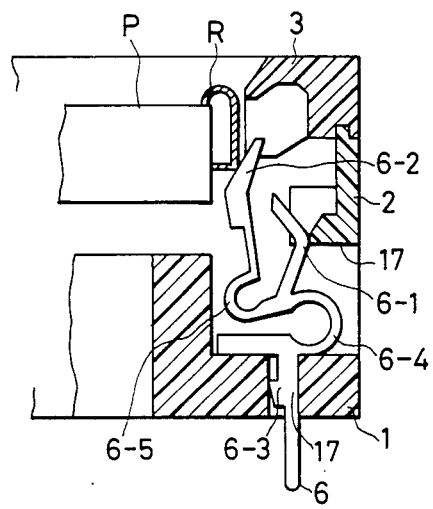
FIGS. 5A, 5B and 5C are diagrammatic partial sectional views for explaining the functions of the socket shown in FIG. 4.
Figure 5B:
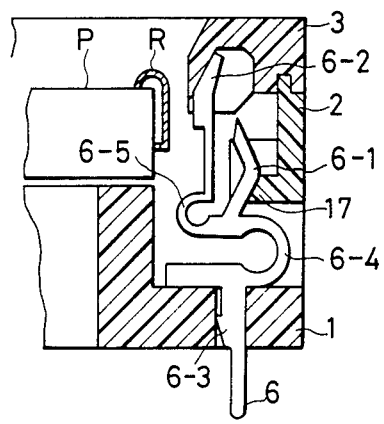
Figure 5C:
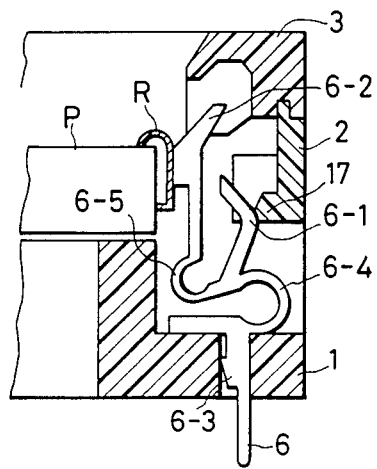

Next, description will be made of the mounting of an IC package. In FIGS. 5A to 5C, it will be noted that, in the normal state of the assembly, the first arm 6-1 of the contacting pin 6 is urged by the jetty 17 of the spacer 2 as shown in FIG. 5A, so that the first spring portion 6-4 is urged to curve further from its relaxed position, while the second arm 6-2 is inclined inwardly than the position of the lead terminal R of the IC package P which is to be mounted. In this state, let us assume that the IC package P is mounted, with its front side facing downward. Whereupon, the bent portion at the base of the lead terminal R is brought to a halt in its state of being in contact with the second arm 6-2 of the contacting pin 6. In this case, the horizontal position of the IC package P is restricted by the corner portions 19 located at four corners of the spacer 2, so that the lead terminal R will be rendered to be placed exactly on the second arm 6-2. Next, as shown in FIG. 5B, the urging cover 3, together with the spacer 2, is pushed downwardly toward the socket body 1 against the force of the spring 9. Whereupon, the jetty 17 of the spacer 2 also moves downwardly to relieve the first arm 6-1 of its applied pressure, so that the second arm 6-2 is caused to move outwardly due to the restoration of the first spring portion 6-4 back to its relaxed state. As a result, the IC package P drops downwardly by its own gravity until it contacts the socket body 1. This state is shown in FIG. 5B, wherein the first and second spring portions 6-4 and 6-5 are both in their relaxed state. Next, when the pressure having been exerted by the urging cover 3 is lifted as shown in FIG. 5C, the urging cover 3, together with the spacer 2, restores the state which they had prior to application of pressure, due to the restoring force of the spring portion 9 which is provided between the socket body 1 and the spacer 2. This state, alike the state shown in FIG. 5A, is such that the first arm 6-1 is urged by the jetty 17 to cause tension of the first spring portion 6-4, and along therewith the second arm 6-2 moves inwardly to contact, with a relatively large area of its own, the side face of the lead terminal R, and along therewith that portion of the second arm which would move further inwardly remains as an urging force for the second spring portion 6-5. Therefore, the contact becomes positive, and also the contact resistance is reduced.

In order to take the IC package P out of the assembly, it is only necessary to establish the state of assembly as shown in FIG. 5B and to invert the posture of the socket, or to such the IC package P by means of, for example, a vacuum pincette.

As will be clear from the foregoing description, in the IC tester socket of the present invention, no contact takes place on the soldered junction regions of the lead terminals R of the IC package P, so that there arises no contamination or injury of the soldered faces, thus making it possible to eliminate unsuccessful connection when the IC package P is mounted on a hardware in actual practice. Also, at the four corners of the spacer frame 2, there are provided the corner portions 19 for positioning purpose. Thus, the mounting of the IC package P onto the socket body 1 can be performed smoothly without causing unstable movements, and there is needed no particular attention to be paid at the time it is mounted in the socket. Furthermore, the normal state (pushed-up state) of the spacer frame 2 and the urging cover 3 is maintained by the force of the springs 9, and the contacting pins 6 do not take part in the pushing-up of the spacer frame 2 and the urging cover 3. Thus, when compared with the above-described conventional systems, the load applied to the contacting pins can be markedly reduced, with the result that there can be provided a socket of this type which is capable of standing the use for a prolonged period of time. Also, the second arm 6-2 is formed via the second spring portion 6-5 which is separate from the first spring portion 6-4, and accordingly the second arm 6-2 is able to contact the lead terminal R more positively and more exactly, an in addition, it is possible to eliminate the mal-contact due to the shifting of the position of mounting the contacting pin 6 and also to the wear of the spring portion of the contacting pin 6.

Figure 6:
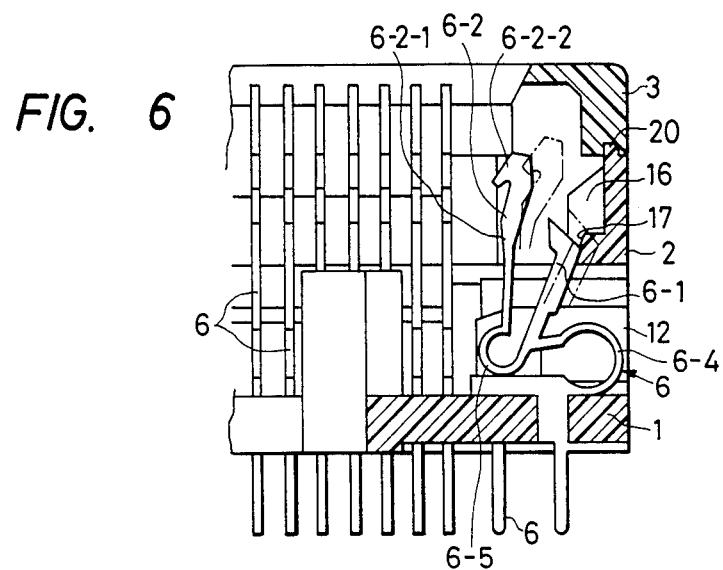
FIG. 6 is a sectional view of the essential portion showing an second embodiment of the IC tester socket according to the present invention.
Figure 7:
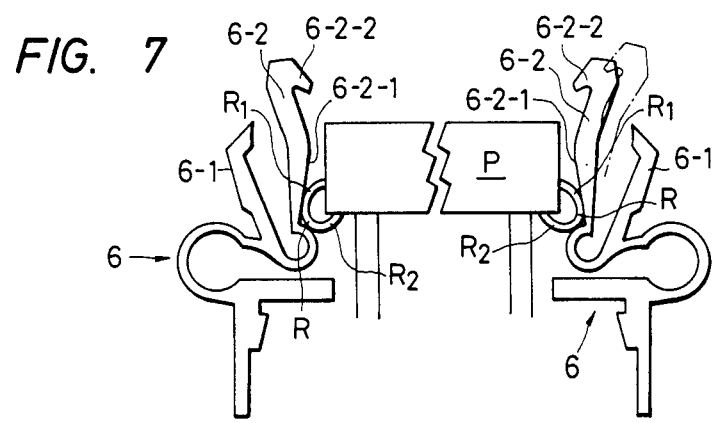
FIG. 7 is an explanatory illustration showing the state of contact between the lead terminals of the IC package mounted in its normal position and the contacting pins in the embodiment of FIG. 6.
Figure 8:
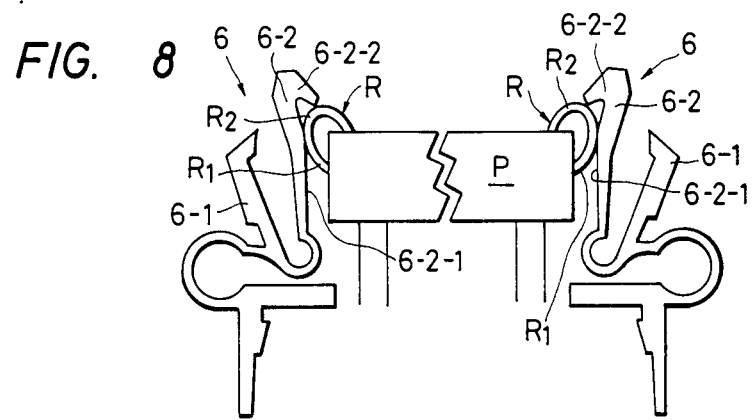
FIG. 8 is an explanatory illustration showing the state of contact between the lead terminals of the IC package mounted in its upside-down posture and the contacting pins in the embodiment of FIG. 6.

FIGS. 6 to 8 show a second embodiment of the IC tester socket according to the present invention. In this instant embodiment also, the general configuration of the IC socket as a whole is substantially the same as that of the above-described first embodiment. Thus, the detailed description of this second embodiment is omitted here, and those parts and portions same as those of the abovementioned embodiment are assigned with identical numerals and symbols. Only the essential portions of the structure will be described in detail. According to the IC tester socket of this latter embodiment, the second arm 6-2 of the contacting pin 6 is provided with the formation of a slant face 6-2-1 serving as a first contacting portion which is inwardly slanted relative to the side face of the IC package P which is placed at its mounting position, and also with the formation of a hook 6-2-2 serving as a second contacting portion projecting inwardly. As shown in FIG. 7, in case the IC package P is mounted in its normal posture on the socket body 1, the abovesaid slant face 6-2-1 is brought into contact with a first bent portion $R_1$ of the lead terminal R and mating two of these slant faces nip the IC package P at both sides thereof while urging the package downwardly. Also, when the IC package P is mounted in its upside-down posture as shown in FIG. 8, the second bent portions $R_2$ of the lead terminals R are contacted by the hooks 6-2-2 so that the IC package P is nipped at both sides thereof. In this second embodiment also, it will be noted that, by pushing the urging cover 3 downwardly against the force of the spring 9

(FIG. 3), the jetty 17 will be caused to descend so that the first and second arms 6-1 and 6-2 of the contacting pin 6 will move outwardly to the position indicated by the chain line in FIG. 6 due to their own restoring forces, with the result that, when an IC package P is to be mounted, the IC package which has been set in its predetermined position will drop and it is brought into contact with the surface of the socket body 1, and thus it is automatically mounted. Next, by relieving the downward urging force exerted by the urging cover 3, the jetty 17 is caused to ascend by the spring force of the spring 9, and accordingly the first arm 6-1 is urged to move inwardly. This movement of the first arm 6-1 is followed by the movement of the second arm 6-2 up to the position indicated by the solid line, so that when the IC package P is mounted in its normal posture, the opposing slant faces 6-2-1 of the second arms 6-2 are brought into contact with their mating lead terminals R to thereby nip the IC package, whereas when the IC package P is mounted in its inverted posture, the hooks 6-2-2 of the second arms 6-2 and the upper end portions of the slant faces 6-2-1 are brought into contact with the lead terminals R to nip the IC package, and thus the mounting of the IC package P onto the IC tester socket completes.

Figure 1:
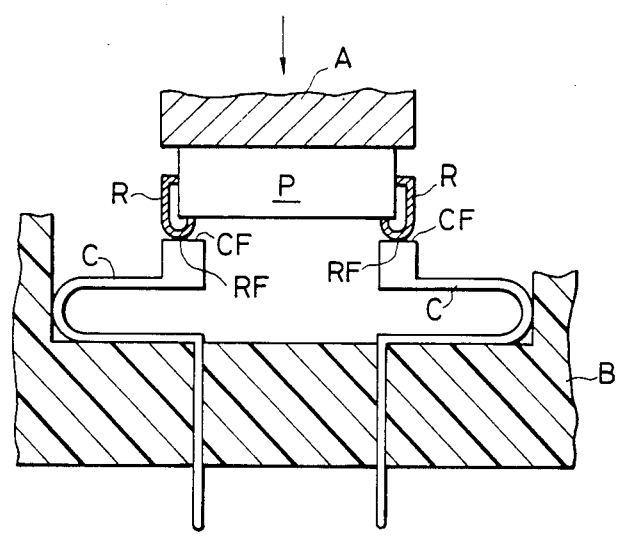
FIG. 1 is an explanatory illustration of the state of use of an example of the conventional IC tester socket.
Figure 2A:
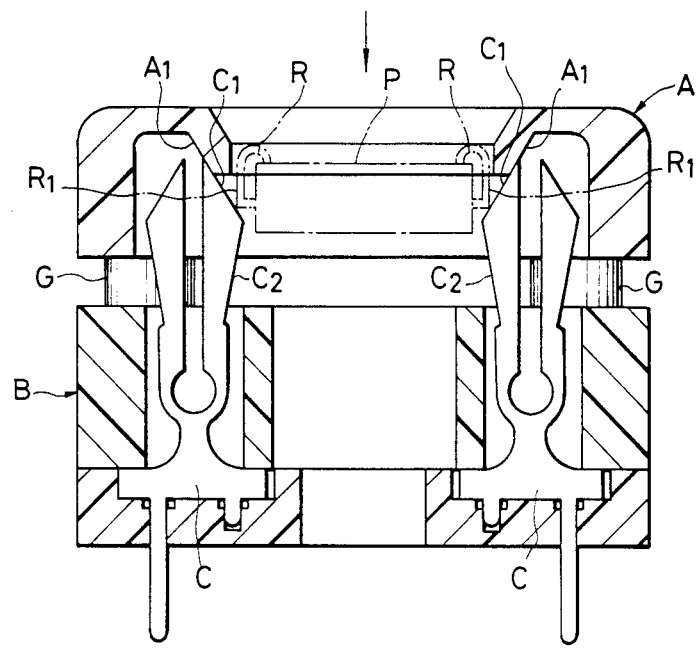
FIG. 2A is a vertical sectional view showing another example of conventional IC tester socket in its normal state.
Figure 2B:
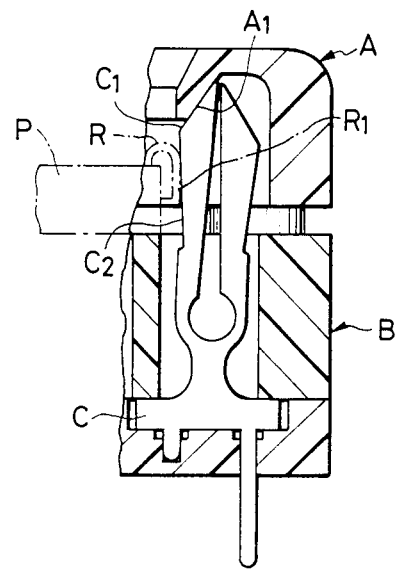
FIG. 2B is a partial sectional view showing the IC testing state by the IC tester socket shown in FIG. 2A.

As will be clear from the foregoing description, when the IC package P is mounted in its normal posture, the first bent portions $R_1$ of the lead terminals R are nipped in their downwardly urged state by the slant faces (the first contacting portions) 6-2-1 and 6-2-1. Accordingly, not only the contact between the lead terminal R and the second arm 6-2 is performed positively, but also there is another advantage that, even when the IC socket is invertedthe IC package P is positively held without causing the drop-out of this package. Also, when the IC package P is mounted in its upside-down posture, the lead terminals R are nipped in such a state that their second bent portions $R_2$ are nipped in its state of being in contact with the hooks 6-2-2. Therefore, similarly to the above case, even when the IC socket is inverted, the IC package P is positively anchored without dropping off the socket. At the same time, there is the further advantage that, due to the contact between the lead terminal R and the upper end portion of the slant face 6-2, there is obtained a better electrical connection. It should be noted here that, while in this instant embodiment, the lead terminal R is formed in an arcuate shape (C-shape), the configuration thereof is not limited thereto, the IC tester socket of the present invention can be used as well in the testing of IC package having lead terminals of such a shape (J-shape) as shown in FIG. 1, and also in the testing of those IC packages provided with lead terminals of various other curved shapes. It is needless to say that, in the above-mentioned second embodiment, the present invention provides also the advantages similar to those obtained in the first embodiment.

What is claimed is:
1. An IC tester socket, comprising:
   a socket body;
   a number of contacting pins, each having a first spring portion of a predetermined resiliency and each extending from said socket body, the contacting pins being arranged to flex inwardly and outwardly relative to a central portion of the socket body and to mate respectively with a number of lead terminals of an IC package to be tested;
   an urging member, mounted on said socket body for vertical movement above the socket body, the urging member having defined in its central portion, a cavity capable of accommodating said IC package and further having, along its peripheral portions, a number of jetties engaged respectively with said number of contacting pins in such a manner wherein the jetties can urge the contacting pins to flex inwardly while placing the first spring portion of each corresponding contacting pin in a strained state when the contacting pin is flexed inwardly; and
   at least one spring, interposed between said socket body and said urging member, for elastically urging said socket body and said urging member to normally part away from each other with a predetermined interval therebetween,
   wherein each of said contacting pins is provided with a leg portion fixedly inserted in said socket body, the first spring portion is formed above said leg portion in an arcuate shape and is contiguously joined to said leg portion, and wherein each of said contacting pins is further provided with: a second spring portion, joined contiguously to said first spring portion at a junction site and formed in an arcuate shape bulging in a direction opposite to the arcuate shape of said first spring portion; a first arm extending in a direction opposite to said leg portion from the junction site of said first spring portion and said second spring portion to engage its mating jetty so that the mating jetty can push inwardly aginst the first arm and thereby urge the contacting pin to flex inwardly; and a second arm contiguously joined to said second spring portion and extending in a direction opposite to said leg portion for being brought into contact with its respective mating lead terminal of said IC package,
   such that when said urging member is pushed downwardly against the force of said at least one spring, the first spring portion of each of said contacting pins is relieved at least partly from the strained state in which its corresponding first arm is pushed by a corresponding one of said jetties, to allow outward movement of each of said contacting pins by the resiliency of their corresponding first spring portions so that said IC package may be accommodated into said cavity, and
   such that when the downward push on said urging member is relieved, said urging member is restored to its normally parted position relative to the socket body by said spring, said first arm is pushed inwardly by a corresponding one of said jetties, and said contacting pins are urged to flex inwardly against the resiliency of the first spring portion and to contact the lead terminals of said IC package which has been accommodated in said cavity.
2. An IC tester socket according to claim 1, in which: said second arm is provided with a first contacting portion for uging a first bent portion of its mating lead terminal of said IC package accommodated in said cavity, and with a second contacting portion for urging a second bent portion of said lead terminal, whereby said IC package is adapted to be locked to said socket body by said first and second contacting portions.
3. An IC tester socket according to claim 2, in which:

said first contacting portion is formed with a slant face inclined relative to a side face of said IC package, and said second contacting portion if formed with a hook.

4. An IC tester socket according to claim 1, in which:

said urging member is provided with corner portions for positioning said IC package accommodated in said cavity.

5. An IC tester socket according to claim 1, in which:

said urging member comprises an urging cover and a spacer frame which can fit one into the other.

6. An IC testing socket comprising:

a socket body having a central top portion which has a chip accommodating space defined thereabout for accommodating an IC package of predetermined dimensions;

a contacting pin, made of a resilient material and having: (a) a base portion fixedly secured in the socket body, (b) a lead contacting portion disposed to be positioned out of the chip accommodating space in a first mode and to move inwardly toward the chip accommodating space while straining the resilient material of the contacting pin in a second mode, (c) an intermediate portion located between the base portion and the lead contacting portion, (d) a jetty engaging portion extending from the intermediate portion, and (e) a first arcuate spring portion interposed between the base portion and the intermediate portion; and an urging member, movably disposed adjacent to the socket body, the urging member including a jetty that slidably engages with the jetty engaging portion so that (a) when the urging member is moved to a first position, the jetty will push against the jetty engaging portion to thereby urge the lead contacting portion to move inwardly toward the chip accommodating space against the resiliency of the first arcuate spring portion and (b) when the urging member is moved to a second position, the jetty will be relieved from pushing against the jetty engaging portion at least partly to thereby allow the lead contacting portion to move outwardly of the chip accommodating space.

7. The IC testing socket of claim 6 wherein the contacting pin further includes a second arcuate spring portion interposed between the intermediate portion and the IC lead contacting portion.

8. An IC lead contacting pin for an IC testing socket which includes a vertically movable jetty, comprising:

a base portion which is vertically disposed for vertical insertion into a base portion of the IC testing socket;

a first C-shaped portion having first and second ends of its C-shape, the first end of the first C-chaped spring portion being integrally connected to the top of the base portion;

a second C-shaped spring portion having first and second ends of its C-shape, the second end of the second C-shaped spring portion being connected to the second end of the first C-shaped spring portion to form a generally S-shaped configuration;

an IC lead contacting terminal, extending vertically from the first end of the second C-shaped spring portion; and a jetty engaging arm, extending at an incline from the second end of the second C-shaped spring portion such that the jetty engaging arm can engage with the vertically movable jetty to squeeze together or release the ends of both the first and second C-shaped spring portions.

9. An IC testing socket having a chip accomodating space defined therein for accomodating a vertically insertable IC chip having a plurality of terminals, comprising:

a socket body;

a contacting pin extending from the socket body and including:

(a) a base portion secured to the socket body, (b) a contact portion disposed to move toward and away from the chip accomodating space to respectively mate and unmate with a corresponding terminal of the IC chip, (c) a first arcuate spring portion coupling the contact portion to the base portion so as to resiliently urge the contact portion away from the chip accomodating space;

(d) a junction portion interposed between the contact portion and the first arcuate spring portion, (e) a second arcuate spring portion interposed between the junction portion and the contct portion, and (f) an actuator arm extending from the junction portion so as to be engaged by the actuating means; and actuating means, engageable with the contacting pin, for overcoming the resiliency of the first arcuate spring portion and moving the contact portion of the contacting pin toward the chip accommodating space.

10. An IC testing socket according to claim 9 wherein the actuator arm includes an inclined portion and the actuating means includes a vertically movable jetty that engages against the inclined portion.

* * * * *